United States Patent [19]

Gardner et al.

[11] Patent Number: 5,429,981
[45] Date of Patent: Jul. 4, 1995

[54] METHOD OF MAKING LINEAR CAPACITORS FOR HIGH TEMPERATURE APPLICATIONS

[75] Inventors: Gary R. Gardner, Golden Valley; Michael S. Liu, Bloomington, both of Minn.

[73] Assignee: Honeywell Inc., Minneapolis, Minn.

[21] Appl. No.: 269,265

[22] Filed: Jun. 30, 1994

[51] Int. Cl.6 .......................................... H01L 21/70
[52] U.S. Cl. ...................................... 437/60; 437/21; 437/919
[58] Field of Search ................ 437/60, 21, 919, 62, 437/67, 238, 979

[56] References Cited

U.S. PATENT DOCUMENTS 5,246,870 9/1993 Merchant .............................. 437/21
5,266,512 11/1993 Kirsch ................................... 437/60
5,270,265 12/1993 Hemmenway et al. ............. 437/67
5,273,915 12/1993 Hwang et al. ........................ 437/60
5,286,670 2/1994 Kang et al. ........................... 437/60

FOREIGN PATENT DOCUMENTS 91-247029 2/1990 Japan.

Primary Examiner—Olik Chaudhuri
Assistant Examiner—S. Mulpuri
Attorney, Agent, or Firm—Gregory A. Bruns

[57] ABSTRACT

A method for making a voltage linear capacitor for use with a metal oxide semiconductor field transistor wherein a capacitor portion of an SOI substrate is heavily doped with phosphorus. The thin oxide layer used for the transistor gate oxide also serves as the capacitor dielectric and the thickness of the dielectric relative to the gate oxide is controlled.

11 Claims, 2 Drawing Sheets

METHOD OF MAKING LINEAR CAPACITORS FOR HIGH TEMPERATURE APPLICATIONS

BACKGROUND OF THE INVENTION

Capacitors are more easily implemented in silicon on insulator (SOI) wafers than in bulk silicon wafers when linearity of the capacitance value with respect to the applied voltage is desired. These linear capacitors can be made by implanting high dose phosphorus into silicon and using the thin gate oxide as the capacitor dielectric. The linear capacitors made on SIMOX (separation of silicon by implantation of oxygen) SOI wafers however are often leaky and prone to failure under voltage ramp break-down testing. The electrical breakdown strength of the dielectric oxide is low in the SIMOX wafers and the SIMOX capacitor yield is low compared with those made on bulk silicon wafers. Defects created by implant damage at high dose and gettering of heavy metal by high concentration of phosphorus promote weak spots in the thin oxide dielectric. These weak spots further cause the failure mechanism of these linear capacitors.

In addition, certain applications also require that the linearity be maintained over a wide range of temperatures, for example 25 to 300 degrees C. so that the capacitors may be used in high temperature applications.

Thus a need exists for a linear SOI capacitor having suitable voltage breakdown characteristics and which may also be used in high temperature applications.

SUMMARY OF THE INVENTION

The present invention solves these and other needs by providing a method of fabricating a linear SOI capacitor by heavily doping, through a masked oxide layer, a capacitor portion of an SOI substrate which will be used as one plate of the capacitor. The oxide layer is removed along with certain contamination from the SOI substrate. A thin oxide is grown on the surface of the substrate to provide the desired gate oxide thickness. By control of the doping, the thickness of the thin oxide over the capacitor portion is limited to maintain a certain relationship to the gate oxide thickness. Polysilicon is deposited and doped and then a mask cut is made to define a transistor gate and the dielectric along with a second capacitor plate.

DETAILED DESCRIPTION OF THE DRAWINGS

Figure 1:
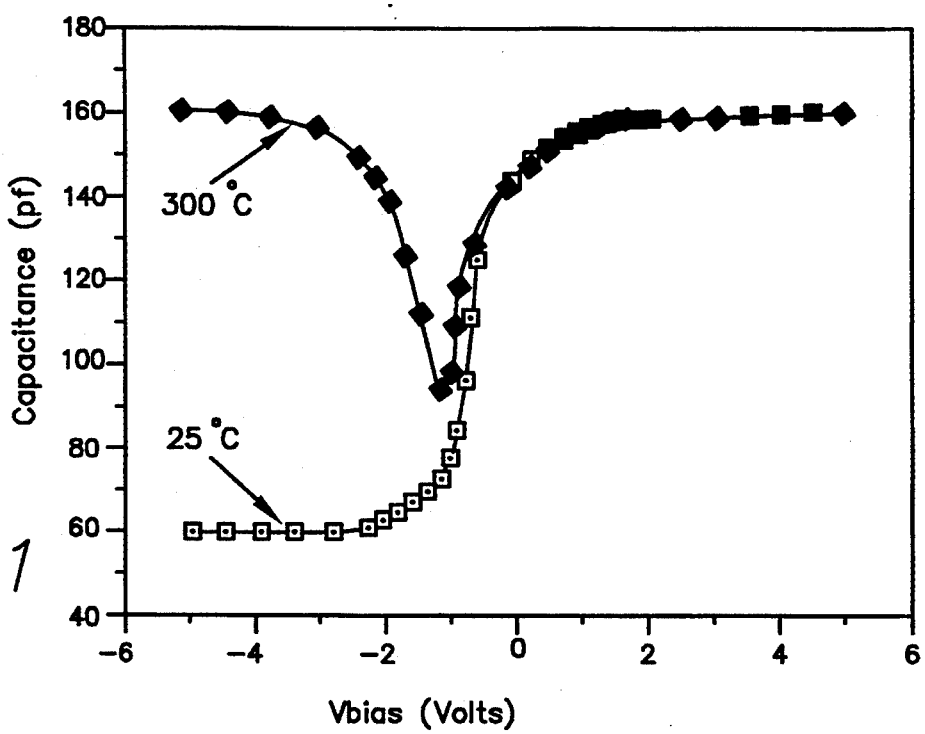
FIG. 1 is a characteristic curve of capacitance versus applied voltage for a typical SOI capacitor that was not made by the method of the present invention.

FIG. 1 illustrates the voltage linearity characteristic at 25 degrees C. and 300 degrees C. of a typical gate oxide capacitor for the voltage range of −5 to +5 volts. Clearly the capacitance is very non-linear. The 300 degree C. curve differs from the 25 degrees C. curve due to the availability of minority carriers from thermal generation. The size of the test capacitor is approximately 300 by 300 microns.

The present invention will be described in the context of process steps using a specific technology, but it is recognized that the present invention applies to other technologies as well.

Figure 2:
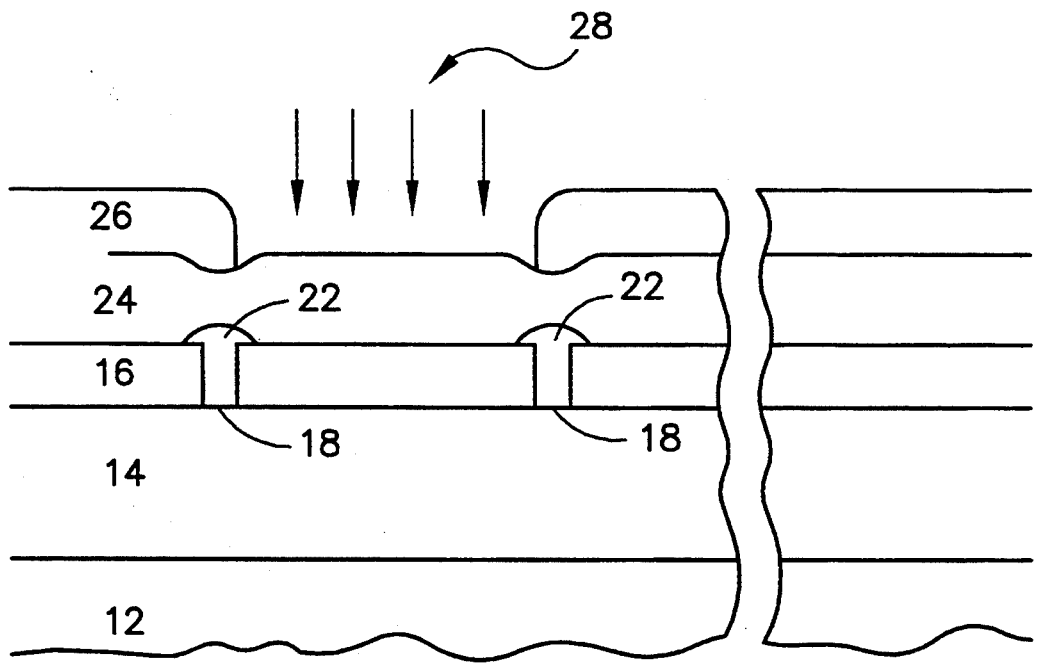
FIGS. 2 and 3 are cross-sectional views of a portion of a semiconductor depicting the method of the present invention.

FIG. 2 illustrates a portion of a semiconductor device according to the present invention which includes a bulk substrate 12, a buried oxide layer 14 and a silicon layer 16. Buried oxide layer 14 and silicon substrate 16 may be formed by implanting a high concentration of oxygen into bulk substrate 12 by conventional SIMOX means or by other known means. Isolation trenches 18 are cut in silicon layer 16 to define a silicon portion 20 which is one plate of the capacitor of the present invention. Oxide 22 is grown to fill trenches 18. The next step is to grow a barrier oxide layer 24. The thickness of barrier oxide layer 24 is not critical, but a thickness of approximately 2000 Angstroms has been used successfully. Next, photoresist 26 is applied and masked to expose the area or region of the desired capacitor. Phosphorus ion implantation is performed into exposed area 20 at an ion energy level of between 30 and 190 KeV and an ion dose between 5E14 and 2E15 per cm$^2$. With this approach, the implantation is through barrier oxide layer 24, and the damage and the contamination gettered by phosphorus are contained in the subsequent oxide growth. This oxide growth or "pregate" oxide is then removed before a new thin oxide is grown for the dielectric.

In the typical metal oxide semiconductor field effect transistor (MOSFET) process, the new thin oxide is grown during the normal gate oxidation process step. After gate oxidation, polysilicon is deposited and doped according to normal practice. Next a mask cut is made to define the gate for the transistor and to define the dielectric and the top plate of the capacitor.

Figure 3:
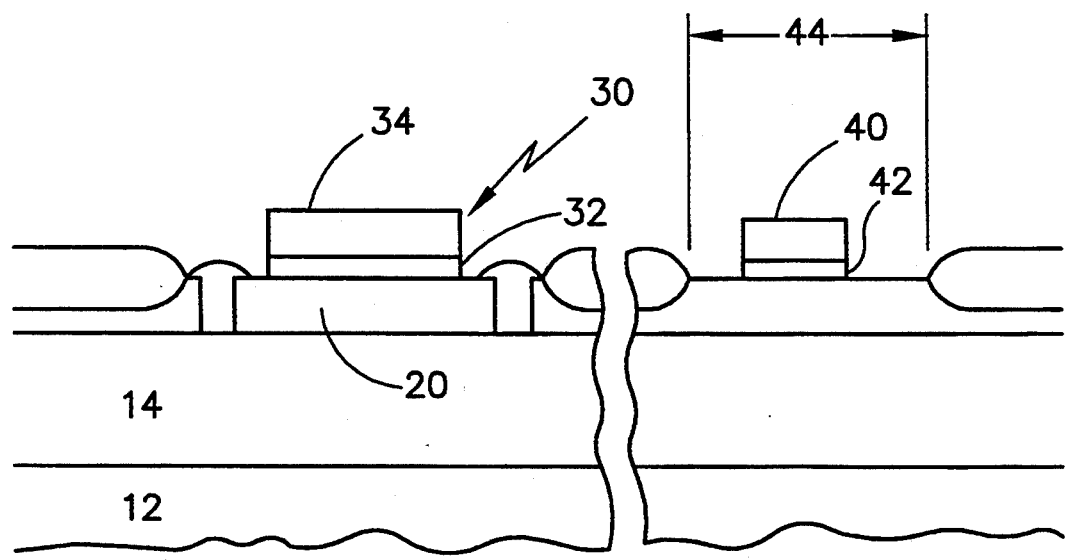

FIG. 3 illustrates the present invention after the new thin oxide layer has been grown, the polysilicon has been deposited and doped and the mask cut has been made. Capacitor 30 includes first plate 20, dielectric 32 and polysilicon layer 34. Polysilicon gate 40 and gate oxide 42 will be part of a transistor to be fabricated adjacent to gate 40 in the area designated 44. Note that the new thin oxide layer will be thicker over silicon portion 20 due to more rapid oxide growth over the phosphorus implant. An important aspect of the present invention is maintaining a predetermined relationship between the thickness of dielectric 32 and gate oxide 42. In order to use the normal gate oxidation process, the thickness of dielectric 32 should exceed the thickness of gate oxide 42 by not more than 30%, and preferably not more than 25%. If this thickness relationship is properly maintained, then no separate additional mask is required to define dielectric 32 and polysilicon capacitor plate 34. The thinner the dielectric 32 the greater the capacitance value, so it is often desirable to have the thickness of dielectric 32 exceed the thickness of gate oxide 42 by only about 5%.

The process of the present invention was described with the phosphorus implant taking place at the beginning of IC processing. Depending on the technology used, the specific process steps will vary. For example, an alternative process may be used wherein the phosphorus implant is introduced just before the gate oxidation. Illustrative steps would include the following. Starting with an SOI substrate, a pad oxide in the range of 200 to 400 angstroms would be grown by thermal oxidation at 850 degrees C. in a wet ambient. Phosphorus ions would be implanted through the pad oxide into the capacitor region at a dose of between 3E14 and 2E15 per cm$^3$ and an energy level between 30 and 190 KeV. For example, with a pad oxide of 200 angstroms a dose of about 0.6E15 and an energy level of 30 KeV has been used successfully. The pad oxide would be removed by etching. A gate oxide would be grown to a thickness of 150 to 400 angstroms which would also be the capacitor dielectric. Polysilicon would be deposited by low pressure CVD to a typical thickness of 3000 to 5000 angstroms and doped according to normal practice. A mask cut would be made to define the gate of a transistor to be formed and to define the second plate and dielectric of the capacitor of the present invention.

Figure 4:
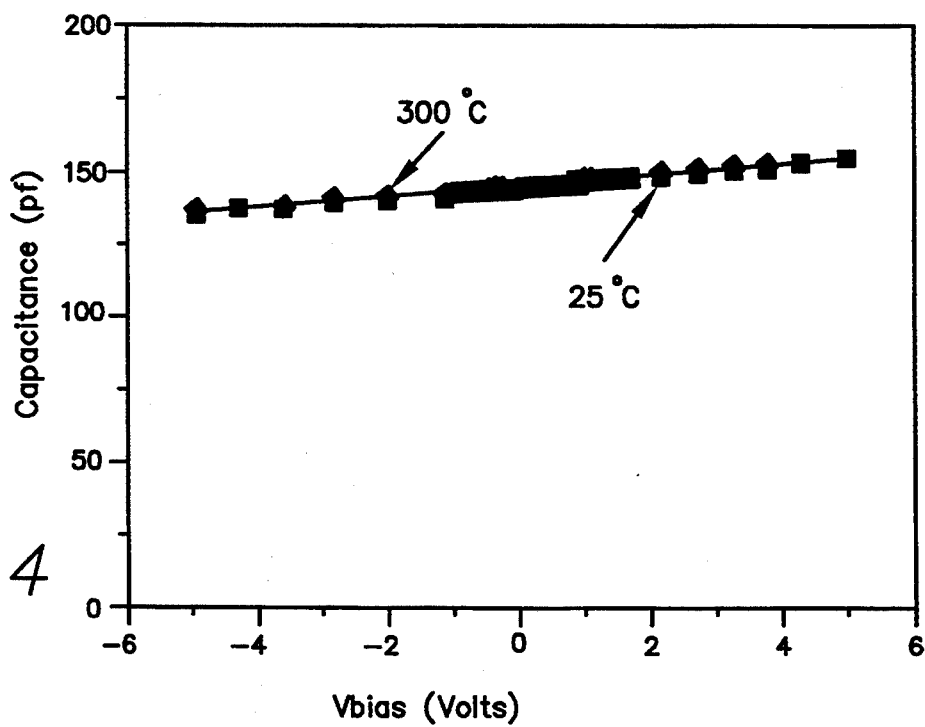
FIG. 4 is a characteristic curve of capacitance versus applied voltage for a SOI capacitor made by the method of the present invention.

FIG. 4 shows the 25 degree C. and 300 degree C. capacitance voltage characteristics of a test linear capacitor made according to the teachings of the present invention. Practically no temperature dependence is observed. This test capacitor was made by implanting a high dose phosphorus of 0.6E15 at 60 KeV energy into the top silicon of the SOI. The dielectric of the linear capacitor is silicon dioxide grown at gate oxidation. For the particular application the gate oxide thickness was chosen to be 200 angstroms. The dielectric for the capacitor is only about 210 angstroms. This is an important feature because it does not complicate the normal gate etch process. From FIG. 4, the voltage linearity is within a few percent for −5 volt to +5 volt. The test capacitor of FIG. 4 is of approximately the same size as the test capacitor of FIG. 1.

Applicant's invention provides for heavy doping to create an N to N+ doping which extends through an SOI substrate portion which will be used as a capacitor plate. The heavy doping is required to achieve the voltage linearity and temperature independence. Phosphorus or arsenic may be used for doping, but phosphorus is preferable. Applicant's invention describes a method of removing metallic contamination from the substrate portion before the thin oxide that will serve as a gate oxide and the capacitor dielectric is grown. The combination of the heavy doping, removal of contamination and controlled relationship of the thickness of the gate oxide and capacitor dielectric results in a precise SOI capacitor.

Another important parameter of an SOI capacitor is the breakdown strength of the dielectric. Conventional processing often results in leaky capacitors and low dielectric breakdown in SIMOX wafers due to contamination. Preliminary measurements of the dielectric strength of the linear capacitor of the present invention indicated that the breakdown typically exceeds 15 volts.

In addition, the SOI capacitor of Applicant's invention has very little parasitic capacitance.

We claim:

1. A method for making a capacitor for use with a metal oxide semiconductor field effect transistor, comprising the steps of:
   providing a silicon on insulator substrate having a first region for use as a first plate of said capacitor and a second region for forming said transistor;
   isolating said first region;
   implanting phosphorus ions into said first region to provide a first concentration of said phosphorus ions within said first region;
   forming an oxide layer over said first and second regions with said oxide layer over said first region having a first thickness and said oxide layer over said second region having a second thickness, with said first thickness exceeding said second thickness by not more than 30 percent;
   depositing a polysilicon over said first and second regions layer; and
   removing a portion of said polysilicon layer and of said oxide layer to define a gate for said transistor and to define a dielectric and a second plate of said capacitor.

2. Method of claim 1 wherein said step of implanting phosphorus ions comprises the following steps:
   forming a barrier oxide on said substrate;
   masking said barrier oxide to allow implantation through said barrier oxide only in said isolated first region; and
   removing said barrier oxide.

3. Method of claim 2 wherein said barrier oxide has a thickness of about 2000 angstroms and said phosphorus ions are implanted at a dose of about 6E14 per cm$^2$ and an ion energy of about 190 KeV.

4. Method of claim 1 wherein said oxide layer over said second region has a thickness of 150 to 400 angstroms.

5. Method of claim 1 wherein said step of implanting phosphorus ions comprises the following steps:
   forming a pad oxide on said substrate:
   masking said pad oxide to allow implantation through said pad oxide only in said isolated first region; and
   removing said pad oxide.

6. Method of claim 5 wherein said pad oxide has a thickness of about 200 angstroms and said phosphorus ions are implanted at a dose of about 0.6E15 and an ion energy of about 30 Kev.

7. A method for making a capacitor for use with a metal oxide semiconductor field effect transistor, comprising the steps of:
   providing a silicon on insulator substrate having a first region for use as a first plate of said capacitor and a second region for forming said transistor;
   isolating said first region;
   implanting impurity ions into said first region to provide a first concentration of said impurity ions within said first region;
   forming by growth an oxide layer over said first and second regions with said oxide layer over said first region having a first thickness and said oxide layer over said second region having a second thickness, with said first thickness exceeding said second thickness by less than 30 percent of said second thickness;
   depositing a polysilicon layer over said first and second regions; and
   removing portions of said polysilicon layer and of said oxide layer to define a gate for said transistor and to define a dielectric and a second plate of said capacitor.

8. Method of claim 7 wherein said impurity ions are selected from the group consisting of phosphorus and arsenic.

9. Method of claim 8 wherein said step of implanting includes implanting phosphorus ions at a dose of about 6E14 per cm$^2$ and an energy of about 190 KeV through a barrier oxide having a thickness of about 2000 angstroms.

10. Method of claim 9 wherein said step of implanting includes implanting phosphorus ions at a dose of about 6E14 per cm$^2$ and an energy of about 60 KeV through a pad oxide having a thickness of about 200 angstroms.

11. A method for making a capacitor for use with a metal oxide semiconductor field effect transistor, comprising the steps of:

providing a silicon on insulator substrate having a first region for use as a first plate of said capacitor and a second region for forming said transistor;

isolating said first region;

forming a first oxide layer on said substrate;

implanting phosphorus ions through said first oxide layer into said first region to provide a first concentration of said phosphorus ions within said first region;

removing said first oxide layer;

forming a second oxide layer over said first and second regions with said second oxide layer over said first region having a first thickness and said second oxide layer over said second region having a second thickness, with said first thickness exceeding said second thickness by not more than 30 percent;

depositing a polysilicon over said first and second regions layer; and removing a portion of said polysilicon layer and of said second oxide layer to define a gate for said transistor and to define a dielectric and a second plate of said capacitor.

* * * * *